(12) United States Patent
Luan et al.

(10) Patent No.: US 9,640,574 B2
(45) Date of Patent: May 2, 2017

(54) IMAGE SENSOR CIRCUIT, SYSTEM, AND METHOD

(75) Inventors: Jing-En Luan, Singapore (SG); Junyong Chen, Singapore (SG)

(73) Assignee: STMICROELECTRONICS PTE. LTD., Singapore (SG)

(*) Notice: Subject to any disclaimer, the term of this patent is extended or adjusted under 35 U.S.C. 154(b) by 0 days.

(21) Appl. No.: 13/029,665

(22) Filed: Feb. 17, 2011

(65) Prior Publication Data
US 2012/0168888 A1    Jul. 5, 2012

Related U.S. Application Data

(60) Provisional application No. 61/428,398, filed on Dec. 30, 2010.

(51) Int. Cl.
*H01L 27/146* (2006.01)
*H04N 5/225* (2006.01)

(52) U.S. Cl.
CPC ..... *H01L 27/14618* (2013.01); *H04N 5/2253* (2013.01); *H04N 5/2257* (2013.01); *H01L 2224/48091* (2013.01); *H01L 2224/73265* (2013.01)

(58) Field of Classification Search
CPC ............... H01L 31/21; H01L 31/0232; H01L 31/02327; H01L 31/0203; H01L 2224/97; H01L 27/14618; H01L 27/14632; H01L 27/14683; B81C 1/00873
USPC ........ 438/64, 69, 70, 73, 75, 80, 81, 57, 66, 438/67, 68
See application file for complete search history.

(56) References Cited

U.S. PATENT DOCUMENTS

| | | | |
|---|---|---|---|
| 6,266,197 B1* | 7/2001 | Glenn et al. | 359/819 |
| 6,275,277 B1* | 8/2001 | Walker et al. | 349/113 |
| 7,479,659 B2 | 1/2009 | Cognetti et al. | |
| 2002/0132389 A1* | 9/2002 | Patel et al. | 438/97 |
| 2003/0036249 A1* | 2/2003 | Bauer et al. | 438/460 |
| 2003/0218251 A1* | 11/2003 | Seo | 257/737 |
| 2004/0164981 A1* | 8/2004 | Fujita | H01L 27/14618 345/418 |
| 2005/0285016 A1* | 12/2005 | Kong et al. | 250/208.1 |
| 2006/0006486 A1* | 1/2006 | Seo et al. | 257/433 |
| 2006/0073675 A1* | 4/2006 | Yamamura | H01L 21/50 438/458 |
| 2008/0055438 A1* | 3/2008 | Lee et al. | 348/294 |
| 2009/0046183 A1* | 2/2009 | Nishida et al. | 348/294 |
| 2010/0022053 A1* | 1/2010 | Mund et al. | 438/116 |
| 2010/0258932 A1* | 10/2010 | Yoshida | H01L 21/561 257/686 |
| 2012/0052252 A1* | 3/2012 | Kohli et al. | 428/174 |

* cited by examiner

*Primary Examiner* — Charles Garber
*Assistant Examiner* — Brigitte Paterson
(74) *Attorney, Agent, or Firm* — Seed IP Law Group LLP

(57) ABSTRACT

A process of forming optical sensors includes sealing an imaging portion of each of a plurality of optical sensors on a sensor wafer with a transparent material. The operation of sealing leaves a bonding portion of each of the optical sensors exposed. The process further includes cutting the wafer into a plurality of image sensor dies after sealing the optical sensors such that each image sensor die includes one of the optical sensors sealed with a corresponding portion of the transparent material.

4 Claims, 9 Drawing Sheets

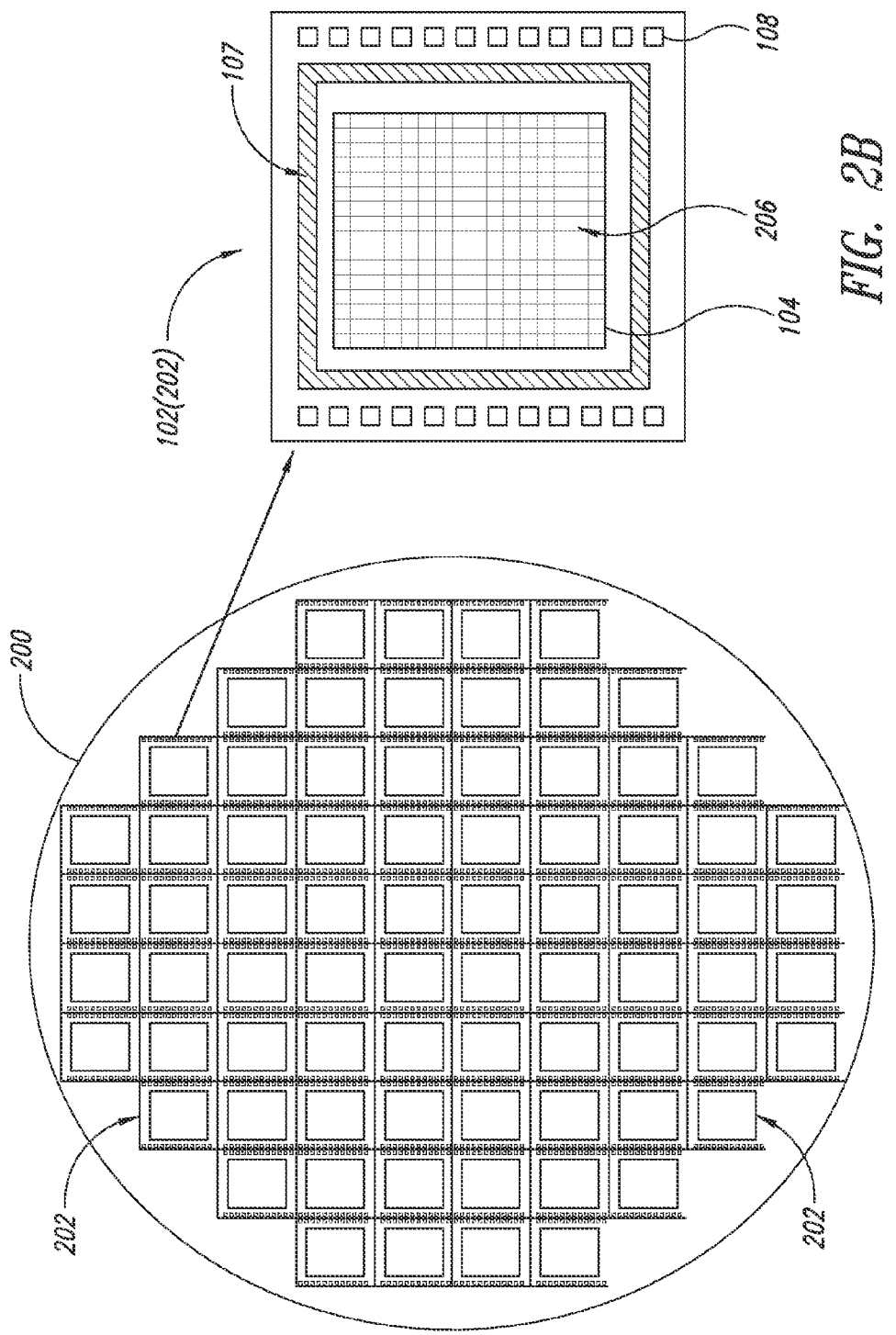

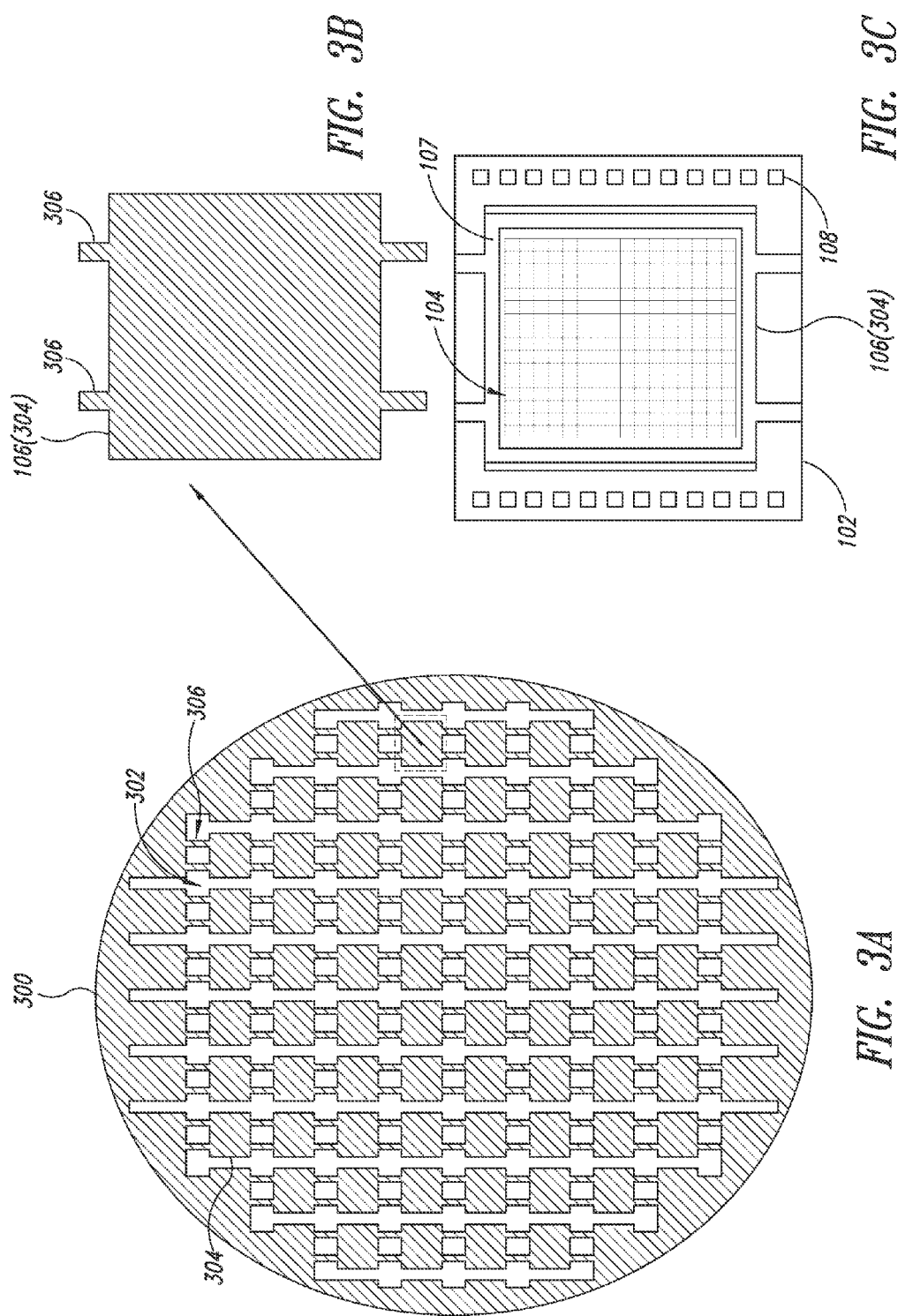

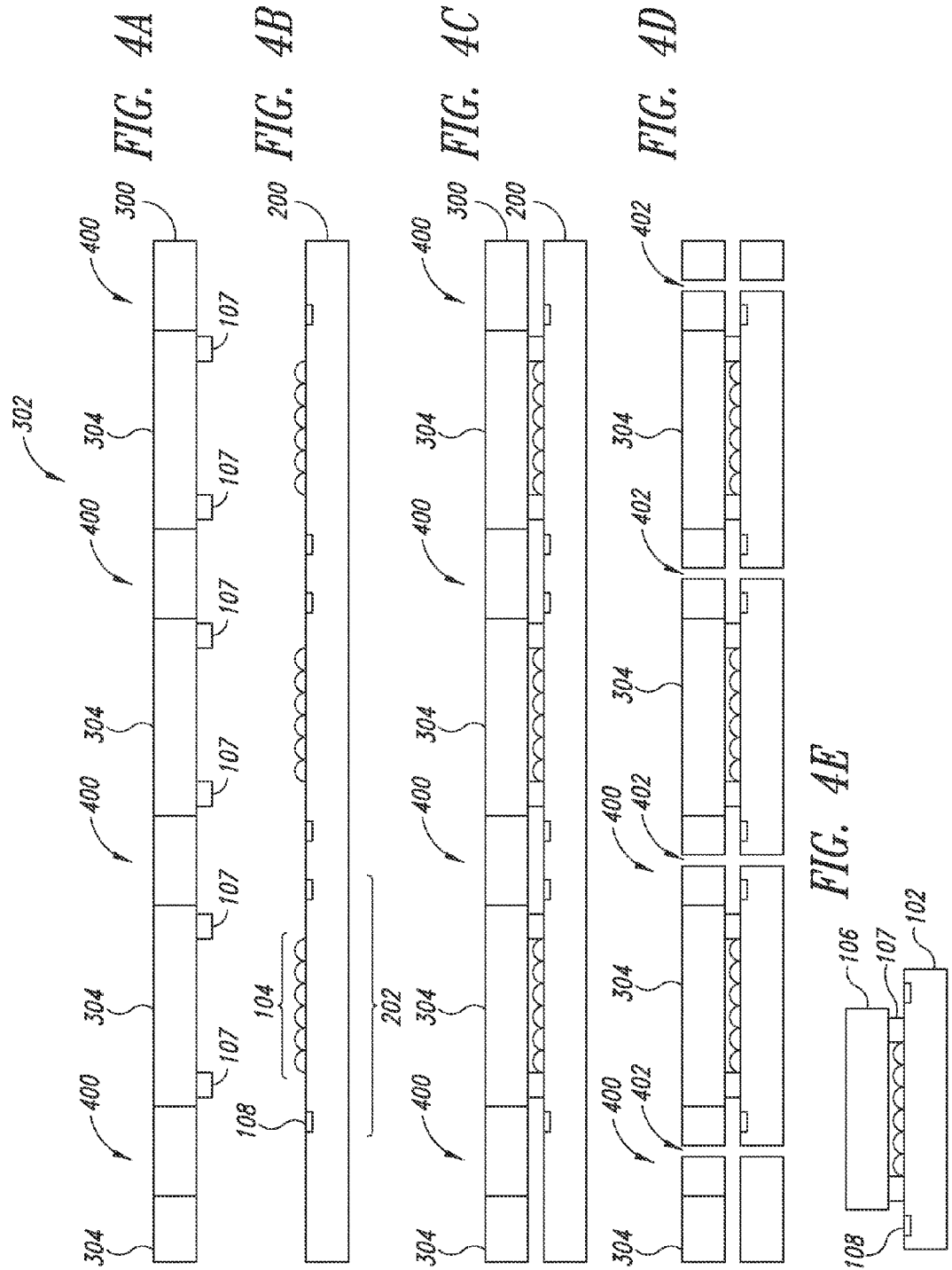

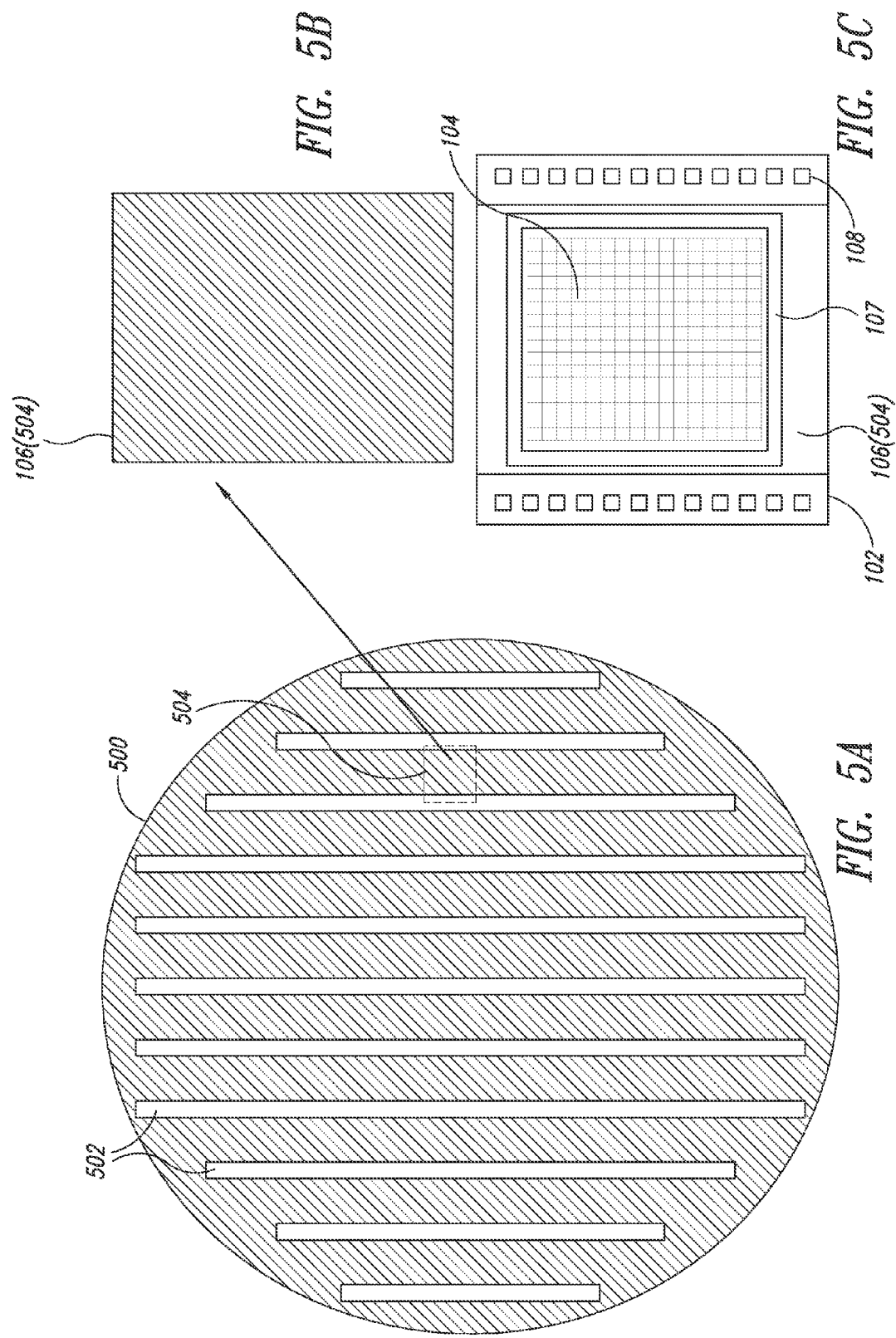

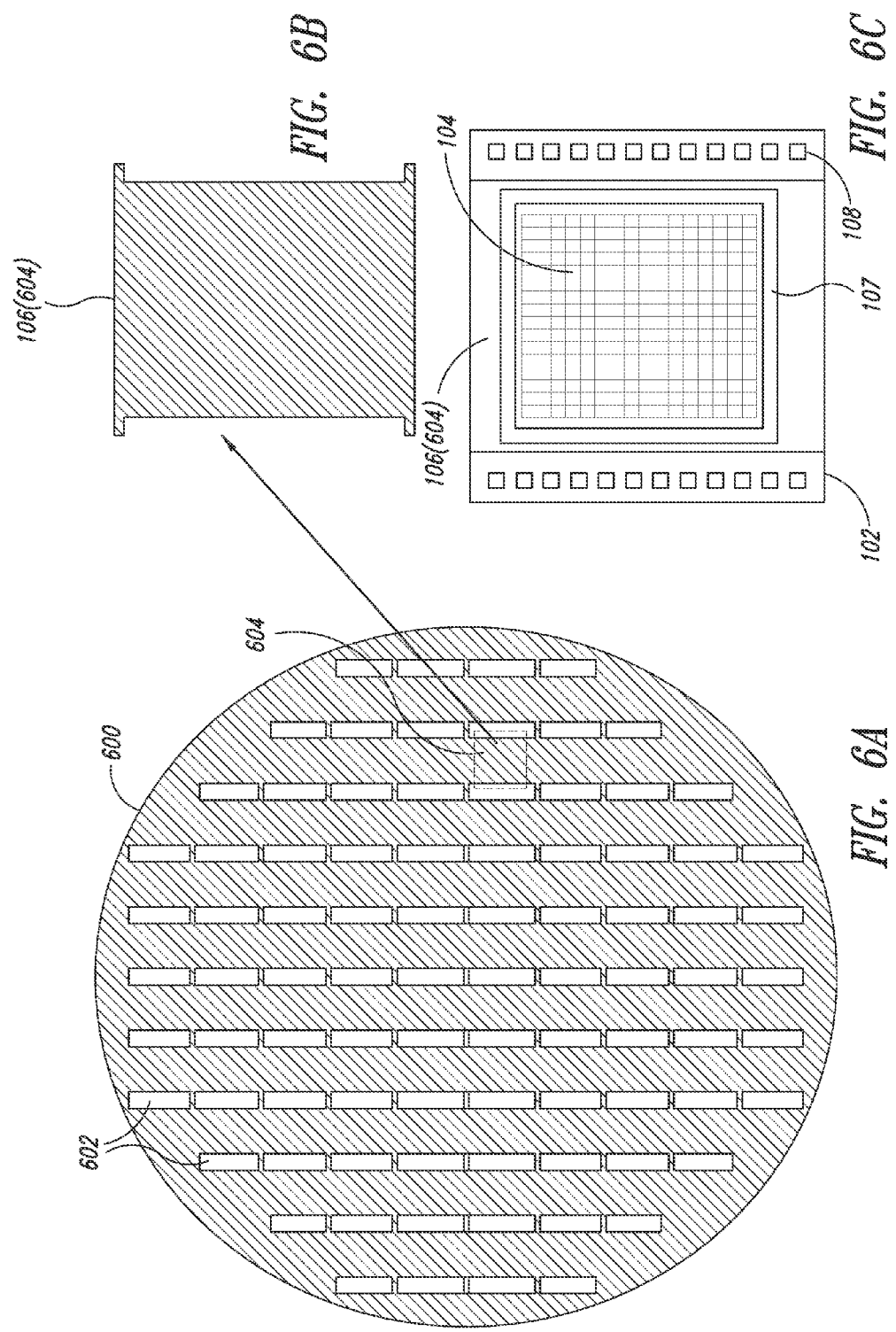

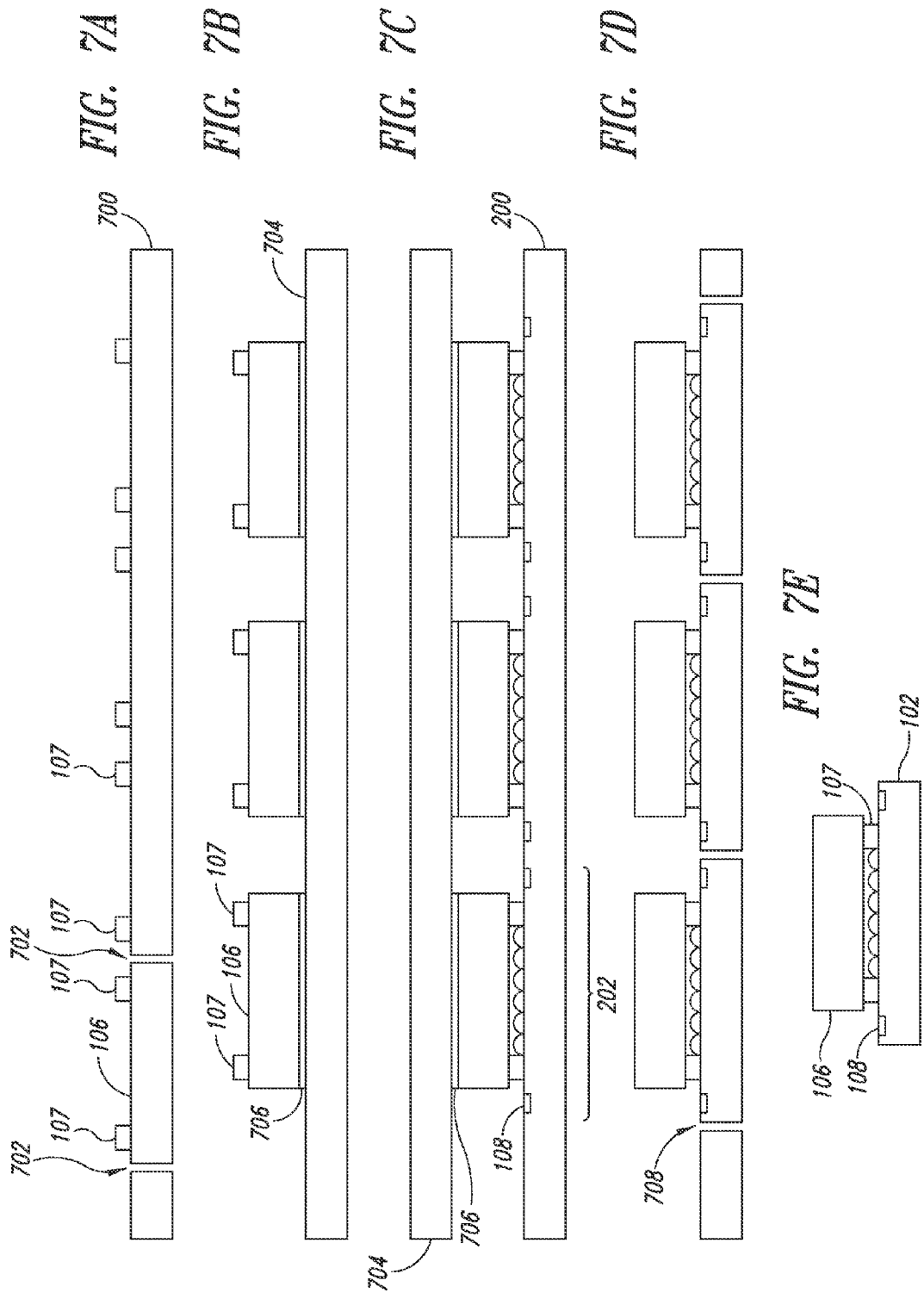

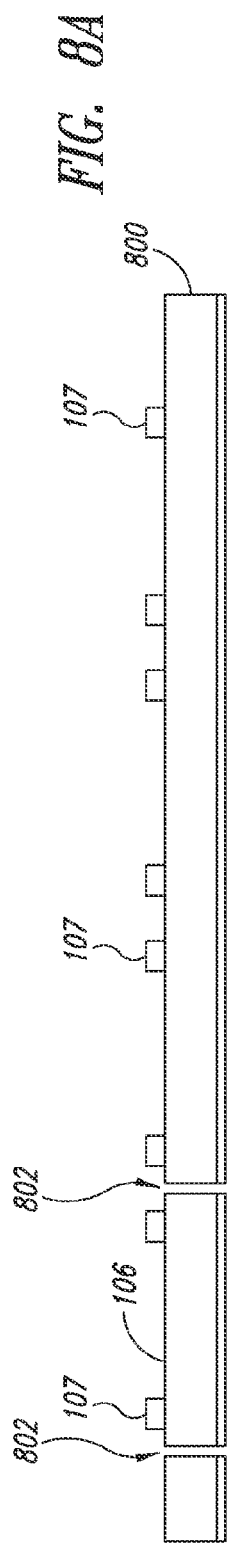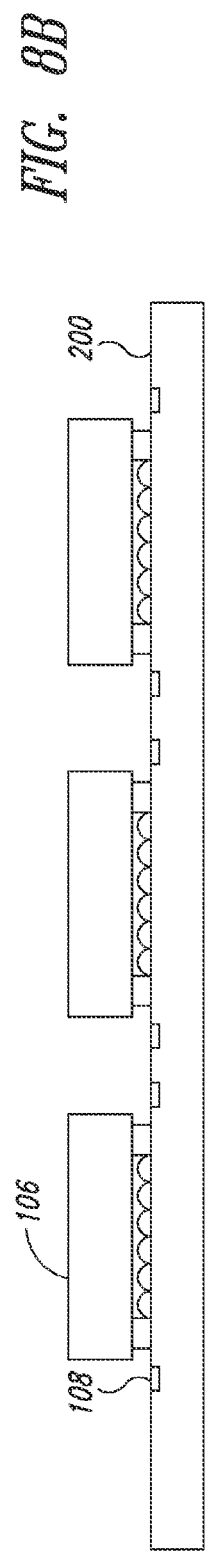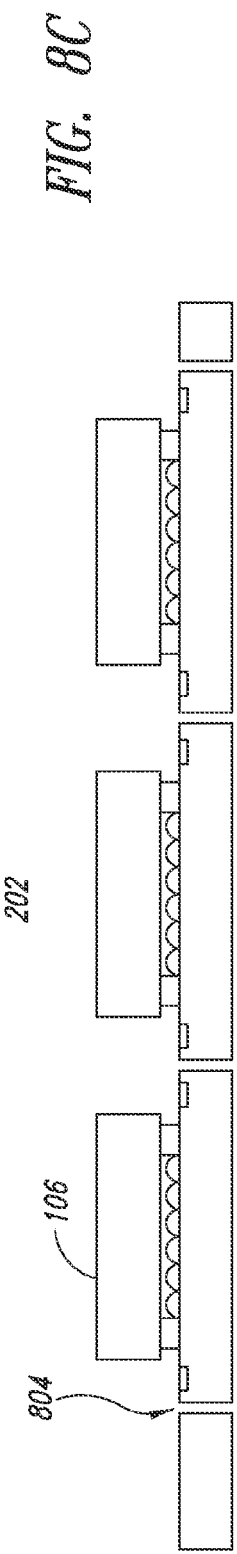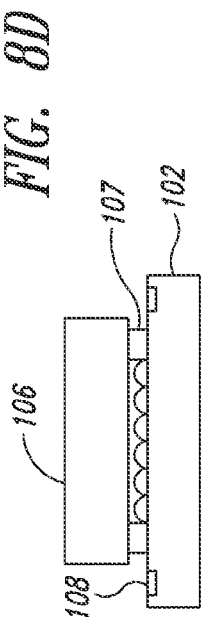

IMAGE SENSOR CIRCUIT, SYSTEM, AND METHOD

PRIORITY CLAIM

The present application claims the benefit of U.S. Provisional Patent Application No. 61/428,398, filed Dec. 30, 2010, which application is incorporated herein by reference in its entirety.

TECHNICAL FIELD

The present invention relates generally to image sensors, and more specifically to image sensors having improved image capture quality and manufacturing yield.

BACKGROUND

Optical sensors or image sensors as they will be referred to here are increasingly being included in more and more different types of electronic devices, such as digital cameras and camcorders, laptop computers, cellular phones, tablet computers, and so on. The demand for higher resolution image sensors has resulted in the need for increasing numbers of individual optical sensors or picture elements ("pixels") that collectively form the image sensor. To maintain the overall size of the image sensor or even reduce the overall size when the image sensor is being placed in compact devices like a cellular phones, the size of the individual pixels has had to decrease dramatically as the resolution of image sensors has gone from 2 megapixels (MP) to 8 MP, 10 MP, 12 MP, 14 MP and beyond. Currently, image sensors having pixel sizes of 2 micrometers (μm), 1.75 μm, and 1.4 μm are being commercially manufactured and image sensors having a 1.1 μm pixel size are currently being developed and thus on the horizon of commercial availability.

As the size of the image sensors and corresponding pixels has continued to decrease, the yield loss of the image sensors during manufacturing has increased significantly. The smaller pixel size results in contaminate particles, such as dust particles, present during the manufacturing of the image sensor adversely affecting the performance of the image sensors. Dust particles that may have been relatively small compared to the size of individual pixels in older, lower resolution image sensors are now of such a size that these dust particles can impair the proper operation of pixels in an image sensor and thereby render that image sensor defective. Current data shows the yield loss (i.e., percentage of image sensors that do not meet required specifications) is 2-5% for image sensors having 1.75 μm pixels, 5-10% for image sensors having 1.4 μm pixels, and for image sensors having 1.1 μm pixels may reach upwards of 20%.

Image sensors are typically either complementary metal-oxide semiconductor (CMOS) or charge-coupled device (CCD) type sensors. During semiconductor manufacturing processes utilized to fabricate these types of image sensors contaminant particles such as dust particles naturally arise and are thus inherently present. As the resolution of the CMOS and CCD image sensors has increased the size of the corresponding pixels has decreased, meaning the size of dust and other contaminant particles has increased relative to the size of the pixels. As a result, these contaminant particles present during the fabrication of high resolution CMOS and CCD image sensors can in some way adversely affect the operation of more pixels in the image sensor. Such adverse operation of more pixels in the image sensor can result in the image sensor failing functionality testing of the image sensor during manufacturing, which ultimately results in rejection of the image sensor. The more image sensors that are rejected the higher the yield loss, and as discussed above as the size of the pixels decreases the yield loss increases due at least in part to the increased relative size of the contaminant particles relative to the pixels. Moreover, it should be noted that contaminant particles can also lower the overall performance (i.e., lower the quality of image capture) for the image sensor even though the image sensor passes functionality testing.

These dust and other contaminant particles are inherently generated during the manufacturing process of image sensors. For example, a large number of image sensors are formed in a semiconductor wafer as is conventional in formation of integrated circuits, as will be understood by those skilled in the art. Once all required process steps have been completed on a semiconductor wafer, the individual image sensors formed therein are separated through it is typically referred to as a "dicing process" or "singulation" and once separated each of the individual pieces is referred to as a "die," as will also be understood by those skilled in the art. This dicing process typically involves sawing the semiconductor wafer to form individual dies and thus creates sawing dust particles that can contaminate the image sensors formed on the respective dies. The individual dies must then be attached to some package substrate or carrier which can involve the generation of more sawing particles and also involves glue that is used to attach the die to the carrier and which can also contaminate or damage the image sensor. Furthermore, wire bonding steps involve electrically connecting the package carrier and the die and can also result in contamination or damage to the image sensor formed on the die. The same is true when a suitable lens is attached to the package carrier. During all these operations, inherent particles present in a "clean room" in which the image sensors are being fabricated can contaminate or damage the pixels of the image sensors on the respective dies. Clean rooms are extremely expensive facilities and thus efforts to reduce the contaminant particles that are present by improving the clean rooms are very costly. Note that in the following description the terms "contamination," "contaminant," and "contaminant particle or particles" will be used interchangeably to broadly to refer to any type of particle that interferes with the proper operation of an image sensor, whether by damaging the image sensor itself or by impairing the proper operation of the image sensor simply by being present on the image sensor.

There is a need to maintain or reduce the yield loss and quality of image capture for image sensors as the size of pixels forming such image sensors continues to decrease.

SUMMARY

According to one embodiment of the present invention, a process of forming optical sensors includes sealing an imaging portion of each of a plurality of optical sensors on a sensor wafer with a transparent material. The operation of sealing leaves a bonding portion of each of the optical sensors exposed. The process further includes cutting the wafer into a plurality of image sensor dies after sealing the optical sensors such that each image sensor die includes one of the optical sensors sealed with a corresponding portion of the transparent material.

According to another embodiment of the present invention, an optical sensor includes a package substrate including bonding pads. An optical sensor die has an imaging portion and a bonding portion including bonding pads. A protective transparent material plate is attached to the optical sensor die to seal the imaging portion while leaving the bonding portion exposed. Bonding wires electrically interconnect bonding pads on the package substrate to bonding pads on the optical sensor die. A lens holding structure is attached to the package substrate and lens elements are secured in a desired position relative to the optical sensor die by the lens holding structure.

BRIEF DESCRIPTION OF THE DRAWINGS

FIG. 2A is a plan view of a sensor wafer showing a sample glue ring for securing protective glass (not shown) to each of a number of image sensor dies formed on the sensor wafer.

FIG. 2B is an exploded plan view showing in more detail the sample glue ring of FIG. 2A positioned around the pixels of the corresponding individual image sensor die.

FIG. 3A is a plan view showing a protective glass wafer having a first pattern formed on the glass wafer according to one embodiment of the present invention.

FIG. 3B is an exploded plan view of one of the individual protective glass portions of the protective glass wafer of FIG. 3A.

FIG. 3C is a plan view showing the individual protective glass portion of FIG. 3B attached to a respective image sensor die.

FIGS. 4A-4E are cross-sectional views showing sequential process steps of attaching the protective glass segments in the glass wafer of FIG. 3A to the respective image sensors of the sensor wafer of FIG. 2A according to one embodiment of the present invention.

FIG. 5A is a plan view showing a protective glass wafer having a second pattern formed on the glass wafer according to another embodiment of the present invention.

FIG. 5B is an exploded plan view of one of the individual protective glass portions of the protective glass wafer of FIG. 5A.

FIG. 5C is a plan view showing the individual protective glass portion of FIG. 5B attached to a respective image sensor die.

FIG. 6A is a plan view showing a protective glass wafer having a third pattern formed on the glass wafer according to another embodiment of the present invention.

FIG. 6B is an exploded plan view of one of the individual protective glass portions of the protective glass wafer of FIG. 6A.

FIG. 6C is a plan view showing the individual protective glass portion of FIG. 6B attached to a respective image sensor die.

FIGS. 7A-7E are cross-sectional views showing sequential process steps of attaching protective glass directly to a sensor wafer containing a number individual image sensor dies and subsequent dicing or singulation according to another embodiment of the present invention.

FIGS. 8A-8D are cross-sectional views showing sequential process steps of attaching protective glass directly to a sensor wafer containing a number individual image sensor dies and subsequent dicing or singulation according to yet another embodiment of the present invention.

DETAILED DESCRIPTION

Figure 1:
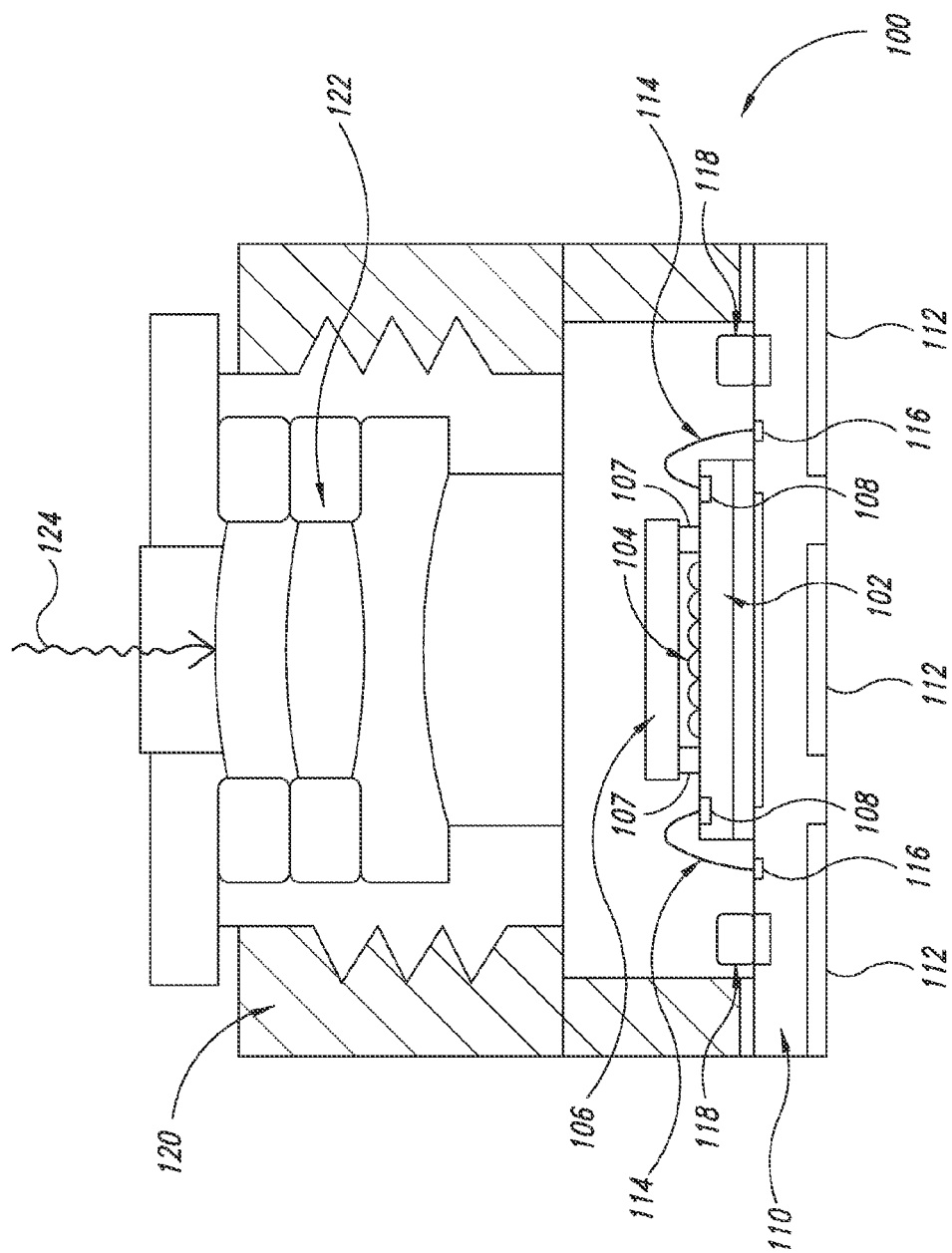
FIG. 1 is a cross-sectional view of an image sensor including an image sensor die having protective glass attached to directly to the die according to one embodiment of the present invention.

FIG. 1 is a cross-sectional view of an optical sensor or image sensor 100 according to one embodiment of the present invention. The image sensor 100 includes an image sensor die 102 having a imaging portion 104 in which pixels are formed and a protective glass portion 106 attached to directly to the image sensor die to cover and protect the imaging portion of the die while leaving a bonding portion of the die that includes bonding pads 108 exposed for subsequent manufacturing operations. The protective glass portion 106 covers and protects the imaging portion 104 by sealing the imaging portion from the manufacturing or other environment in which the image sensor die 102 is present. In this way, contaminant particles such as dust that are present in the manufacturing environment of the image sensor die 102 do not damage or otherwise adversely affect the operation the image sensor die, as will be described in more detail below.

In the present description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components or steps of any of the respective described embodiments may also be within the scope of the present invention although not expressly described in detail below. Finally, the operation of well-known components and/or processes has not been shown or described in detail below to avoid unnecessarily obscuring the present invention.

In the image sensor 100 the protective glass portion 106 is attached directly to the image sensor die 102 through a suitable glue layer 107 that is formed on either the protective glass portion or the image sensor die prior to attachment of the two, as will be described in more detail below. The glue layer 107 surrounds the imaging portion 104 of the image sensor die and in this way the glue layer in combination with the protective glass portion 106 seals the imaging portion to protect it from contamination due to dust or other types of contaminant particles during subsequent assembly operations of the image sensor 100. Note that although the protective glass portion 106 is connected directly to the image sensor die 102, the bonding pads 108 of the image sensor die are left exposed so that the die may be physically positioned and electrically interconnected to other components in the image sensor 100 in a conventional way. In this way conventional steps of existing assembly processes may be utilized to fabricate image sensor 100, meaning potentially costly and disruptive changes to such existing processes need not be made.

The image sensor die 102 is physically mounted to a package carrier or substrate 110 that includes electrical interconnections 112 for connecting the image sensor to other electrical components (not shown). The image sensor die 102 is electrically connected to the package substrate 110 through bonding wires 114 as shown. More specifically, the bonding wires 114 are connected between the bonding pads 108 on the image sensor die 102 and bonding pads 116 on the package substrate 110. The illustrated electrical interconnections 112 are actually additional funding bottom of the package substrate 110 and are referred to generically as electrical interconnections 112 to include not only such bonding pads but also additional electrical interconnections contained in the package substrate and not illustrated in FIG. 1. Additional surface mount devices 118 are also shown mounted to the package substrate 110 and include additional electrical circuitry of the image sensor 100.

The image sensor 100 further includes a lens holding structure 120 that is attached to the package substrate 110 as illustrated and includes components for positioning lens elements 122 in a desired position adjacent the assembly formed by the image sensor die 102 and protective glass portion 106. In operation, light 124 incident upon the lens elements 122 is directed by the lens elements through the protective glass portion 106 to the imaging portion 104 of the image sensor die 102. In response to the light 124 incident upon the imaging portion 104, which includes the pixels (not shown) of the image sensor die 102, the image sensor 100 generates a value for each one of the pixels and in this way captures an image corresponding to the light 124. Note that the detailed structure and operation of the image sensor die 102, whether the image sensor die be a CMOS, CCD, or other type of image sensor, will be understood by those skilled in the art. Accordingly, this detailed structure and operation of the image sensor die 102 along with the detailed operation of the complete image sensor 100 will not be described in more detail in order to avoid unnecessarily obscuring salient aspects of the present invention and the embodiments thereof being described herein.

FIG. 2A is a plan view of a sensor wafer 200 including a number of image sensors 202 formed on the sensor wafer. As will be appreciated by those skilled in the art, when the image sensor being formed is a CMOS or CCD type image sensor the sensor wafer 200 is a semiconductor wafer. In this situation each image sensor 202 is an integrated circuit formed in the semiconductor wafer and including transistors, resistors, capacitors and other components as required to thereby form the required circuitry for the image sensor. A large number of individual image sensors 202 are formed on the single sensor wafer 200, with each of these individual image sensors becoming an image sensor die 102 (FIG. 1) when singulated (i.e., when the sensor wafer 200 is cut such as through sawing or other suitable separation technique to thereby disconnect each individual image sensor 202 and thereby form the individual image sensor dies 102).

FIG. 2B is an exploded plan view showing one of the image sensors 202 of FIG. 2A, which actually corresponds to the image sensor die 102 of FIG. 1 since it has been cut from the sensor wafer 200 of FIG. 2A. The plan view of FIG. 2B shows in more detail the glue ring 107 (FIG. 1) surrounding the imaging portion 104 of the image sensor die 102. The imaging portion 104 includes the pixels (not shown) of the image sensor die 102, with a checkerboard-type pattern 206 shown in FIG. 2B representing the microlenses and filters associated with the pixels, as will be appreciated by those skilled in the art. In the embodiment of FIGS. 2A and 2B, the glue ring 107 surrounds the imaging portion 104 but does not extend to the bonding pads 108 in the bonding portion of the image sensor die 102. This is true because when the protective glass portion 106 (not shown in FIGS. 2A and 2B) is attached to the image sensor die 102 via the glue ring 107 the outer edges of the protective glass portion must not cover the bonding pads 108, as will be discussed in more detail below.

FIG. 3A is a plan view showing a protective glass wafer 300 having a first pattern 302 formed in the glass wafer according to one embodiment of the present invention. More specifically, the first pattern 302 is formed in the protective glass wafer 300 to include a number of individual protective glass segments 304. The first pattern 302 is formed such that when the protective glass wafer 300 is positioned adjacent the sensor wafer 200 of FIG. 2A the protective glass segments 304 in the first pattern align with respective image sensors 202. Each protective glass segment 304 aligns with a corresponding image sensor 202 so that the individual protective glass segments cover the imaging portion 104 of the image sensors when adhered.

In one embodiment, the protective glass wafer 300 is formed from infrared (IR) glass, although the specific material of the protective glass wafer may vary in other embodiments of the present invention. In fact, the material need not be glass at all but can be formed from any suitable material that is substantially transparent in the wavelength range or spectrum of interest, such as the visible spectrum where the image sensor 100 is to be used in a conventional camera or device containing a camera such as a cellular phone. IR glass is typically utilized and functions to filter IR wavelength light so that IR light does not illuminate the imaging portion 104 of the image sensor die 102 (FIG. 1) during operation of the image sensor 100 (FIG. 1). This is done because such IR light can result in color aliasing and blurring during operation of the image sensor 100 in capturing images, as will be appreciated by those skilled in the art.

Note that whatever material is selected for the protective glass wafer 300, the material must be transparent to light in the desired wavelength spectrum being captured. For example, where the image sensor 100 is to be utilized in a camera, either a standalone device or as part of another device like a cellular phone, the protective glass wafer 300 must be formed from a material that is transparent to light in the visible wavelength spectrum. Also note that those skilled in the art will understand various suitable ways for forming the first pattern 302 in the glass wafer 300.

FIG. 3B is an exploded plan view of one of the individual protective glass segments 304 of the protective glass wafer 300 of FIG. 3A. Actually, FIG. 3B can more properly be said to show the protective glass portion 106 of FIG. 1, which corresponds to one of the protective glass segments 304 of the protective glass wafer 300 prior to the singulation process. FIG. 3C is a plan view showing the individual image sensor die 102 of FIG. 1 with the individual protective glass portion 106 of FIG. 3B attached to the image sensor die via the glue layer 107. As seen in FIG. 3C and as previously mentioned with regard to FIG. 2B, the bonding pads 108 of the image sensor die 102 are left exposed after attachment of the protective glass portion 106. FIG. 3C corresponds to FIG. 2B except that in FIG. 3C the protective glass portion 106 is shown positioned over the imaging portion 104 of the image sensor die 102.

In the embodiment of FIGS. 3A-3C, the protective glass wafer 300 is round, as is the sensor wafer 200 of FIG. 2A and as is typically true for such wafers. The first pattern 302 is formed in the protective glass wafer 300 to include a number of individual protective glass segments 304. The protective glass segments 304 are defined by the first pattern 302, which includes a grid of uniformly spaced parallel slits formed in the protective glass wafer 300. The grid of the first pattern 302 includes a first set of parallel slits, each slit having a variable length and ends extending proximate the edge of the glass wafer 300. The position within the grid of each slit on the glass wafer 300 determines the length of the slit. A second set of parallel slits orthogonal to the slits in the first set is also included in the first pattern 302, with the intersections of adjacent slits in the first and second sets defining respective glass segments 304. Furthermore, in the embodiment of FIG. 3A the slits in either the first or second set have projections 306 (see FIGS. 3A and 3B) that extend over a width of the slits while the slits in the other set have no such projections. The projections 306 of adjacent slits thus hold the segments 304 in place in the first pattern 302 as seen in FIGS. 3A and 3B where four such projections 306 hold each segment 304 in place in the first pattern 302. Note that the spacing of the slits in the grid in this embodiment is determined by the arrangement of the image sensors 202 on the sensor wafer 200 of FIG. 2A. Thus, although the slits of the grid are uniformly spaced in the described embodiment they could be non-uniformly spaced in other embodiments where the arrangement of the sensors 202 is non-uniform. Spacing could also be different for each of the sets of slits in other embodiments of the first pattern 302.

FIGS. 4A-4E are cross-sectional views showing sequential process steps of attaching the protective glass segments 304 in the glass wafer of FIG. 3A to the respective image sensors 202 of the sensor wafer 200 of FIG. 2A according to one embodiment of the present invention. In the embodiment of FIGS. 4A-4E, the glue layer 107 is properly patterned on the glass wafer 300 such that when the glass wafer and sensor wafer 200 are properly aligned the glue layer secures each protective glass segment 304 in place over a corresponding image sensor 202 on the sensor wafer. FIG. 4A shows the glass wafer 300 of FIG. 3A including the glue layer 107 properly patterned thereon. One skilled in the art will understand various suitable ways to form the glue layer 107 in the desired pattern on the glass wafer 300. In FIG. 4A the darker sections on which the glue layer 107 is formed correspond to the protective glass segments 304 (FIG. 3A) while the lighter sections between adjacent protective glass segments correspond to openings in the glass wafer 300 that form the first pattern 302 (FIG. 3A). These openings are designated as openings 400 and FIGS. 4A-4D.

FIG. 4B is cross-sectional view of the sensor wafer 200 of FIG. 2A. FIGS. 4A and 4B show the glass wafer 300 and sensor wafer 200 properly aligned such that the protective glass segments 304 containing the glue layer 107 properly patterned on the underside of the protective glass segments are aligned over the imaging portions 104 of the image sensors 202. FIG. 4C shows the intermediate assembly formed when the glass wafer 300 of FIG. 4A is attached to the sensor wafer 200 of FIG. 4B through the patterned glue layer 107. Once again, those skilled in the art will appreciate suitable methods for attaching the glass wafer 300 to the sensor wafer 200 as shown in the intermediate assembly of FIG. 4C. For example, the glue layer 107 may bond the glass wafer 300 to the sensor wafer 200 through the application of appropriate pressure to the glass and sensor wafers. Alternatively, the intermediate assembly of FIG. 4C may be heated in order to cause the glue layer 107 to adhere the glass wafer 300 to the sensor wafer 200. The material from which the glue layer 107 is formed will determine, at least in part, the steps required to bond the glass wafer 300 to the sensor wafer 200. Also note although the glue layer 107 is formed on the glass wafer 300 in the embodiment of FIGS. 4A-4E, the glue layer could, as previously mentioned, alternatively be patterned on the sensor wafer 200, with the sensor wafer and glass wafer 300 thereafter once again being positioned and attached as shown in FIG. 4C. The glue layer 107 may be, for example, a photo-definable material, like benzocyclobutene (BCB), S1818, or B-stage epoxy, and so on, as will be appreciated by those skilled in the art.

FIG. 4D shows the singulation process in which the intermediate assembly of the glass wafer 300 and sensor wafer 200 of FIG. 4C is cut along lines 402 to thereby singulate the individual image sensors 202 formed in the sensor wafer 200 and the corresponding protective glass segments 304. The lines 402 along which the intermediate assembly of FIG. 4C is cut in FIG. 4D are of course determined by the location of the individual image sensors 202 in the sensor wafer 200 and the first pattern 302 in the glass wafer 300. Once the operation of cutting is completed in FIG. 4D the assembly of FIG. 4E is obtained for each image sensor 202 and corresponding protective glass segment 304 formed in the sensor wafer 200 and glass wafer 300, respectively. As indicated in FIG. 4E, each individual image sensor 202 now corresponds to the image sensor die 102 (FIG. 1) having the protective glass portion 106 (FIG. 1) attached thereto through the glue layer 107.

As seen from the illustrations in FIGS. 4A-4D, with the process according to this embodiment of the present invention each individual image sensor 202 has the corresponding protective glass segments 304 attached to cover and protect the imaging portion 104 of the image sensor prior to any cutting of the sensor wafer 200 and glass wafer 300. More specifically, in the intermediate assembly of FIG. 4C the protective glass segments 304 cover and protect the imaging portions 104 of the image sensors 202 prior to the singulation process of FIG. 4D. This reduces the likelihood that dust or other contaminant particles, particularly those that arise during the singulation process, will contaminate the image portion 104 of any of the image sensors 202. The yield loss caused by contaminant particles that arise during singulation would be expected to stay the same or even decrease with this approach even as the resolution of the image sensor dies 102 increases.

FIG. 5A is a plan view showing a protective glass wafer 500 having a second pattern 502 formed in the glass wafer according to another embodiment of the present invention. More specifically, the second pattern 502 is formed in the protective glass wafer 500 to once again include a number of individual protective glass segments 504 defined along continuous lengths of the glass wafer as indicated FIG. 5A. The second pattern 502 is formed such that when the protective glass wafer 500 is positioned adjacent the sensor wafer 200 of FIG. 2A the protective glass segments 504 in the second pattern align with respective image sensors 202 (FIG. 2A). Each protective glass segment 504 aligns with a corresponding image sensor 202 so that the individual protective glass segments cover the imaging portion 104 of the image sensors. In this embodiment the protective glass wafer 300 may once again be formed from infrared glass or other suitable material and once again those skilled in the art will understand various suitable ways for forming the second pattern 502 in the glass wafer 500.

FIG. 5B is an exploded plan view of one of the individual protective glass segments 504 of the protective glass wafer 500 of FIG. 5A. FIG. 5B can once again more properly be said to show the protective glass portion 106 of FIG. 1, which corresponds to one of the protective glass segments 504 of the protective glass wafer 500 prior to the singulation process. FIG. 5C is a plan view showing the individual image sensor die 102 of FIG. 1 with the individual protective glass portion 106 of FIG. 5B attached to the image sensor die via the glue layer 107. As seen in FIG. 5C the bonding pads 108 of the image sensor die 102 are once again left exposed after attachment of the protective glass portion 106. FIG. 5C corresponds to FIG. 2B except that in FIG. 5C the protective glass portion 106 is shown positioned over the imaging portion 104 of the image sensor die 102. Moreover, in contrast to FIG. 3C the protective glass portion 106 in FIG. 5C is formed from the glass wafer 500 of FIG. 5A having the second pattern 502. The protective glass portion 106 performs the same function in FIGS. 5C and 3C but the original glass wafers 500 and 300 from which the protective glass portion is formed are different. A process that is essentially the same as that described with reference to FIGS. 4A-4E and the glass wafer 300 of FIG. 3A can also be applied to the glass wafer 500 of FIG. 5A.

In the embodiment of FIGS. 5A-5C, the second pattern 502 is formed in the circular protective glass wafer 500 to and includes a plurality of uniformly-spaced parallel slits as seen in FIG. 5A. Each slit has a variable length and has ends extending proximate the edge of the glass wafer 500, where the position of each slit on the circular glass wafer 500 determines the length of the slit. Once again, the spacing and lengths of the slits in this embodiment, just as with the embodiment of FIG. 3A, is determined by the arrangement of the image sensors 202 on the sensor wafer 200 of FIG. 2A.

FIG. 6A is a plan view showing a protective glass wafer 600 having a third pattern 602 formed in the glass wafer according yet to another embodiment of the present invention. More specifically, the third pattern 602 is formed in the protective glass wafer 600 to once again include a number of individual protective glass segments 604. Each protective glass segment 604 aligns with a corresponding image sensor 202 on the sensor wafer 200 so that the individual protective glass segments cover the imaging portion 104 of the image sensors. The protective glass wafer 600 may once again be formed from infrared glass or other suitable material and once again those skilled in the art will understand various suitable ways for forming the third pattern 602 in the glass wafer 600.

FIG. 6B is again an exploded plan view of one of the individual protective glass segments 604 of the protective glass wafer 600 of FIG. 6A. FIG. 6B can once again more properly be said to show the protective glass portion 106 of FIG. 1, which corresponds to one of the protective glass segments 604 of the protective glass wafer 600 prior to singulation. FIG. 6C is a plan view showing the individual image sensor die 102 of FIG. 1 with the individual protective glass portion 106 of FIG. 6B attached to the image sensor die via the glue layer 107. The bonding pads 108 of the image sensor die 102 are once again left exposed after attachment of the protective glass portion 106. FIG. 6C corresponds to FIG. 2B except that in FIG. 6C the protective glass portion 106 is shown positioned over the imaging portion 104 of the image sensor die 102. The protective glass portion 106 in FIG. 6C is formed from the glass wafer 600 of FIG. 6A having the third pattern 602 and performs the same function of covering and protecting the imaging portion of the die 102. Once again a process that is essentially the same as that described with reference to FIGS. 4A-4E and the glass wafer 300 of FIG. 3A can also be applied to the glass wafer 600 of FIG. 6A.

In the embodiment of FIGS. 6A-6C the protective glass wafer 600 is again round and the third pattern 602 is formed in the protective glass wafer 300 to include a number of uniformly-spaced segmented parallel slits. Each slit has a variable length and has ends extending proximate the edge of the glass wafer 600, where the position of each slit on the circular glass wafer determines the length of the slit. Once again, the spacing and lengths of the slits in this embodiment, just as with the embodiment of FIGS. 3A and 5A, is determined by the arrangement of the image sensors 202 on the sensor wafer 200 of FIG. 2A.

FIGS. 7A-7E are cross-sectional views showing sequential process steps of attaching the protective glass segments 304/504/604 in the glass wafers 300, 500, 600 in FIGS. 3A, 5A, and 6A, respectively, according to another embodiment of the present invention. In the embodiment of FIGS. 7A-7E, the glue layer 107 is properly patterned on a glass wafer 700 as shown in FIG. 7A, where the glass wafer 700 corresponds to one of the glass wafers 300/500/600. With the embodiment of FIGS. 7A-7E, the glass wafer 700 having the glue layer 170 pattern thereon is then singulated as shown in the left of FIG. 7A through cut lines 702. This singulation of the glass wafer 700 essentially results in the formation of a number of the protective glass portions 106 (FIG. 1) that will then be attached to respective image sensors 202 on the sensor wafer 200 of FIG. 2A, as will now be described in more detail with reference to FIGS. 7B-7E.

After this singulation of the glass wafer 700 in FIG. 7A, the resulting protective glass portions 106 are then attached to a suitable carrier 704 as shown in FIG. 7B. A variety of suitable methods and materials may be utilized to attach the protective glass portions 106 to the carrier 704 and the same is true regarding suitable materials for the carrier 704 itself, as will be appreciated by those skilled in the art. In the embodiment of FIGS. 7B-7E ultraviolet (UV) tape 706 is utilized to adhere the individual protective glass portions 106 to the carrier 704. The protective glass portions 106 are of course arranged on the carrier 704 such that when the assembly including the carrier 704 and the attached protective glass portions 106 as shown in FIG. 7B is aligned with the sensor wafer 200 as shown in FIG. 7C, the protective glass portions align with the image sensors 202 formed in the glass wafer 200. The carrier 704 is then removed. This may also be done in a variety of different ways. Where UV tape 706 is used to adhere the protective glass portions 106 to the carrier 704, the carrier would be formed from a material that is transparent to UV light such that when the assembly of FIG. 7C is exposed to UV light the UV tape 706 changes so that the carrier may then be removed. Note that after the carrier 704 is removed any UV tape 706 that remains on the upper surfaces of the protective glass portions 106 after exposure to the UV light are removed. Other tape materials, like temperature released, can be used as long as the tape material can be easily removed after the protective glass portions 106 are attached to the image sensors 202. FIG. 7D shows the singulation process in which the sensor wafer 200 of the assembly of FIG. 7C, after removal of the carrier 704, is cut along lines 708 to thereby singulate the individual image sensors 202 (FIG. 2A). Once the singulation process of FIG. 7D is completed the assembly of FIG. 7E is obtained, where the assembly includes the image sensor die 102 with a corresponding protective glass portion 106 attached to be used in the image sensor 100 of FIG. 1.

FIGS. 8A-8E are cross-sectional views showing sequential process steps of attaching the protective glass segments 304/504/604 in the glass wafers 300, 500, 600 in FIGS. 3A, 5A, and 6A, respectively, according to yet another embodiment of the present invention. In the embodiment of FIGS. 8A-8E, the glue layer 107 is properly patterned on a glass wafer 800 as shown in FIG. 8A, where the glass wafer again corresponds to one of the glass wafers 300/500/600. With the embodiment of FIGS. 8A-8E, the glass wafer 800 having the glue layer 170 pattern thereon is singulated as shown in the left of FIG. 8A through cut lines 802. This singulation of the glass wafer 700 results in the formation of a number of the protective glass portions 106 (FIG. 1) that will then be attached to respective image sensors 202 on the sensor wafer 200 of FIG. 2A, as will now be described in more detail with reference to FIGS. 7B-7E. In this embodiment, the protective glass portions 106 are then individually placed and attached in the proper positions over the image sensors 202 of the glass wafer 200 as shown FIG. 8B. As seen in FIG. 8C, once the protective glass portions 106 are attached in FIG. 8B the glass wafer 200 with these protective glass portions attached is singulated as shown in FIG. 8C. Once the singulation process of FIG. 8C is completed the assembly of FIG. 8D is obtained, where the assembly once again includes the image sensor die 102 with a corresponding protective glass portion 106. As was true for the embodiment of FIGS. 4A-4E, in the embodiments of FIGS. 8A-8D and FIGS. 7A-7E the glue layer 107 may alternatively be patterned on the sensor wafer 200.

Figure 9:
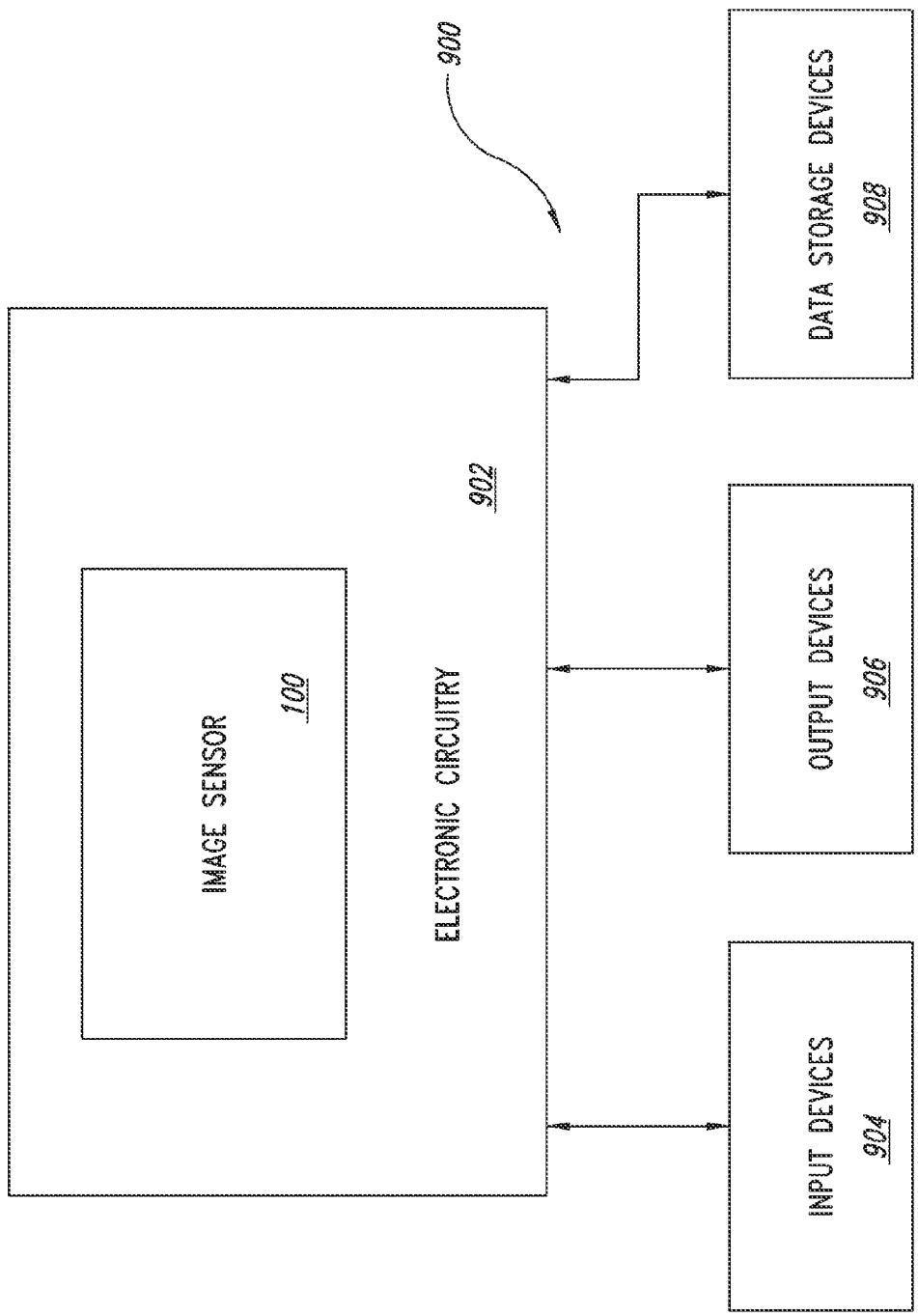
FIG. 9 is a functional block diagram of an electronic system including one or more image sensors of FIG. 1 according to another embodiment of the present invention.

FIG. 9 is a functional block diagram of an electronic system 900 including the image sensor 100 of FIG. 1 according to another embodiment of the present invention. The electronic system 900 includes electronic circuitry 902 that contains the image sensor 100. This electronic circuitry 902 can be any of a variety of different types of circuitry to perform the desired function of the system 900. For example, the electronic system 900 may be an imaging device such as a digital camera, an electronic device including imaging functionality such as a cellular phone, tablet computer, personal computer, medical imaging system, or any other type of electronic system that requires imaging functionality. The electronic circuitry 902 includes circuitry for performing the required functions of the system 900 and may include analog and digital circuitry and specific software for performing specific calculations or tasks.

The electronic system 900 also includes one or more input devices 904 such as a keypad, keyboard, voice recognition circuitry, and mouse coupled to the electronic circuitry 902 to allow an operator to interface with the electronic system. The electronic system 900 can also include one or more output devices 906 coupled to the electronic circuitry 902, with such output devices being, for example, a video display, speaker, printer, and so on. One or more data storage devices 908 may also be coupled to the electronic circuitry 902 to store data or retrieve data. Examples of storage devices 908 include non-volatile memory like FLASH memory, volatile memory like RAM and SRAM, hard and floppy disks, tape cassettes, compact disk read-only (CD-ROMs) and compact disk read-write (CD-RW) memories, digital video disks (DVDs), and so on.

One skilled in the art will understand that even though various embodiments and advantages of the present invention have been set forth in the foregoing description, the above disclosure is illustrative only, and changes may be made in detail, and yet remain within the broad principles of the invention. Moreover, the functions performed by various components described above may be implemented through components other than those expressly disclosed for the various embodiments described above. Moreover, the described functions of the various components may be combined to be performed by fewer elements or performed by more elements, depending upon design considerations for the device or system being implemented, as will appreciated by those skilled in the art. Also, although the above image sensor dies are described as being semiconductor dies note that embodiments of the present invention include image sensor dies formed from different materials but presented with the same or similar problems of yield loss due to contamination during manufacture. Therefore, the present invention is to be limited only by the appended claims.

What is claimed is:

1. A method, comprising:
    sealing an imaging portion of each of a plurality of optical sensors on a sensor wafer with a portion of a transparent material wafer while leaving a bonding portion of each of the optical sensors exposed; and
    cutting the sensor wafer into a plurality of image sensor dies after sealing the optical sensors such that each image sensor die includes one of the plurality of optical sensor sealed with a corresponding portion of the transparent material wafer;
    wherein the sealing comprises:
        patterning the transparent material wafer to facilitate subsequent formation of the portions of the transparent material wafer on the respective image sensor dies, wherein the patterning includes removing portions of the transparent material wafer prior to dicing the transparent material wafer; and
        forming a glue layer on one of the wafers;
        wherein the transparent material wafer has a circular shape and wherein patterning the transparent material wafer includes forming a plurality of transparent material segments arranged to correspond to an arrangement of the optical sensors on the sensor wafer and forming a grid of parallel slits in the transparent material wafer, the grid comprising:
    a first set of parallel slits, each slit having a variable length and ends extending proximate the edge of the transparent material wafer with the position within the grid determining the length of the slit; and
    a second set of parallel slits orthogonal to the slits in the first set, each slit in the second set having ends extending proximate an edge of the transparent material wafer with the position within the grid determining the length of the slit,
        wherein the slits in either the first or second set have projections that extend over a width of the slits while the slits in the other set have no such projections.

2. The method of claim 1 wherein the slits of the first and second sets are uniformly spaced.

3. A method, comprising:
    forming a grid of linear slits extending through a transparent material wafer to facilitate subsequent attachment of portions of the transparent material wafer to respective image sensor dies on a sensor wafer, the forming of the grid of linear slits including removing portions of the transparent material wafer prior to cutting the transparent material wafer, the grid comprising:
        a first set of parallel slits of variable length; and
        a second set of parallel slits of variable length, orthogonal to the slits in the first set, the first and second sets of parallel slits extending proximate the edge of the transparent material wafer;
    sealing an imaging portion of each of a plurality of the image sensor dies with a corresponding portion of the transparent material wafer while leaving a bonding portion of each image sensor die exposed; and
    cutting the sensor wafer into a plurality of image sensor dies after sealing the imaging portion.

4. The method of claim 3 wherein each of the sensors includes a CCD sensor.

* * * * *